US008609548B2

(12) United States Patent
Xu et al.

(10) Patent No.: US 8,609,548 B2
(45) Date of Patent: Dec. 17, 2013

(54) METHOD FOR PROVIDING HIGH ETCH RATE

(75) Inventors: Qing Xu, Fremont, CA (US); Camelia Rusu, Pleasanton, CA (US); Jaroslaw W. Winniczek, Daly City, CA (US); Frank Y. Lin, Fremont, CA (US); Alan J. Miller, Moraga, CA (US)

(73) Assignee: Lam Research Corporation, Fremont, CA (US)

( * ) Notice: Subject to any disclaimer, the term of this patent is extended or adjusted under 35 U.S.C. 154(b) by 164 days.

(21) Appl. No.: 13/188,174

(22) Filed: Jul. 21, 2011

(65) Prior Publication Data

US 2012/0309194 A1    Dec. 6, 2012

Related U.S. Application Data

(63) Continuation-in-part of application No. 13/154,075, filed on Jun. 6, 2011, now Pat. No. 8,440,473.

(51) Int. Cl.
*H01L 21/302* (2006.01)
*H01L 21/461* (2006.01)

(52) U.S. Cl.
USPC ............ 438/714; 257/E21.529; 257/E21.129; 216/79

(58) Field of Classification Search
USPC ............... 438/9, 714; 257/E21.529, E21.129; 216/79
See application file for complete search history.

(56) References Cited

U.S. PATENT DOCUMENTS

| 5,501,893 | A | | 3/1996 | Laermer et al. |
| 5,807,761 | A | | 9/1998 | Coronel et al. |
| 6,051,503 | A | * | 4/2000 | Bhardwaj et al. ............. 438/705 |
| 6,160,621 | A | | 12/2000 | Perry et al. |
| 6,238,588 | B1 | | 5/2001 | Collins et al. |
| 6,261,962 | B1 | | 7/2001 | Bhardwaj et al. |
| 6,417,013 | B1 | | 7/2002 | Teixeira et al. |
| 6,716,758 | B1 | | 4/2004 | Donohoe et al. |
| 6,950,178 | B2 | | 9/2005 | Rueger et al. |
| 7,135,410 | B2 | | 11/2006 | Jacobs et al. |
| 7,306,745 | B1 | | 12/2007 | Bhardwaj et al. |
| 2004/0033697 | A1 | * | 2/2004 | Kumar et al. ................. 438/710 |
| 2004/0157457 | A1 | | 8/2004 | Xu et al. |

(Continued)

FOREIGN PATENT DOCUMENTS

KR    10-1998-0033000    7/1998

OTHER PUBLICATIONS

U.S. Appl. No. 13/154,075, filed Jun. 6, 2011.
Hopkins, 'The Benefits of Process Parameter Ramping During The Plasma Etching of High Aspect Ratio Silicon Structures,' Materials Research Society, vol. 546, pp. 63-68, 1999.
Kamioka, 'An Ellipsometric Study of the Effects of DC Bias of the Plasma Oxidation of Silicon,' Solid State Communications, vol. 97, No. 6, pp. 531-534, 1996.
International Search Report dated Dec. 14, 2012 from International Application No. PCT/US2012/040523.
Written Opinion dated Dec. 14, 2012 from International Application No. PCT/US2012/040523.
International Search Report dated Jan. 2, 2013 from International Application No. PCT/US2012/039997.
Written Opinion dated Jan. 2, 2013 from International Application No. PCT/US2012/039997.
Notice of Allowance dated Jan. 16, 2013 from U.S. Appl. No. 13/154,075.

*Primary Examiner* — Caridad Everhart
(74) *Attorney, Agent, or Firm* — Beyer Law Group LLP

(57) ABSTRACT

A method for etching features into an etch layer in a plasma processing chamber, comprising a plurality of cycles is provided. Each cycle comprises a deposition phase and an etching phase. The deposition phase comprises providing a flow of deposition gas, forming a plasma from the deposition gas in the plasma processing chamber, providing a first bias during the deposition phase to provide an anisotropic deposition, and stopping the flow of the deposition gas into the plasma processing chamber. The etching phase, comprises providing a flow of an etch gas, forming a plasma from the etch gas in the plasma processing chamber, providing a second bias during the etch phase, wherein the first bias is greater than the second bias, and stopping the flow of the etch gas into the plasma processing chamber.

12 Claims, 6 Drawing Sheets

(56) References Cited

U.S. PATENT DOCUMENTS

| | | |
|---|---|---|
| 2004/0263827 A1 | 12/2004 | Xu et al. |
| 2005/0112884 A1* | 5/2005 | Gormley .................. 438/689 |
| 2005/0211873 A1 | 9/2005 | Krishna et al. |
| 2005/0287815 A1 | 12/2005 | Lai et al. |
| 2006/0000799 A1 | 1/2006 | Doh et al. |
| 2006/0292877 A1* | 12/2006 | Lake ........................ 438/694 |
| 2007/0175856 A1* | 8/2007 | Johnson et al. ................ 216/2 |
| 2007/0281479 A1 | 12/2007 | Lee et al. |
| 2008/0078504 A1 | 4/2008 | Vukovic |
| 2009/0050603 A1 | 2/2009 | Heo et al. |
| 2009/0180113 A1 | 7/2009 | Monkowski et al. |
| 2009/0184089 A1 | 7/2009 | Chebi et al. |

* cited by examiner

METHOD FOR PROVIDING HIGH ETCH RATE

CROSS REFERENCE TO RELATED APPLICATIONS

This application is a continuation-in-part and claims priority under 35 U.S.C. §120 to U.S. patent application Ser. No. 13/154,075, filed on Jun. 6, 2011, now U.S. Pat. No. 8,440,473 by Xu et al. and entitled "USE OF SPECTRUM TO SYNCHRONIZE RF SWITCHING WITH GAS SWITCHING DURING ETCH" which is hereby incorporated by reference for all purposes.

BACKGROUND OF THE INVENTION

1. Field of the Invention

The invention relates to a method of obtaining a structure on a semiconductor wafer by etching an etch layer.

2. Description of the Related Art

In forming semiconductor devices on a substrate, an etch layer is etched. The etch layer may be part of the substrate or a layer above the substrate. The etching may occur in a plasma processing chamber.

SUMMARY OF THE INVENTION

To achieve the foregoing and in accordance with the purpose of the present invention, a method for etching features into an etch layer in a plasma processing chamber comprising a plurality of cycles is provided. Each cycle comprises a deposition phase and an etching phase. The deposition phase comprises providing a flow of deposition gas, forming a plasma from the deposition gas in the plasma processing chamber, providing a first bias during the deposition phase to provide an anisotropic deposition, and stopping the flow of the deposition gas into the plasma processing chamber. The etching phase, comprises providing a flow of an etch gas, forming a plasma from the etch gas in the plasma processing chamber, providing a second bias during the etch phase, wherein the first bias is greater than the second bias, and stopping the flow of the etch gas into the plasma processing chamber.

In another manifestation of the invention, a method for providing a gas modulated semiconductor process in a plasma processing chamber comprising a plurality of cycles wherein each cycle comprises a first phase and a second phase is provided. The first phase comprises providing a flow of first phase gas, forming a plasma from the first phase gas in the plasma processing chamber, and stopping the flow of the first phase gas into the plasma processing chamber. The second phase comprises providing a flow of second phase gas, forming a plasma from the second phase gas in the plasma processing chamber, and stopping the flow of the second phase gas into the plasma processing chamber. A parameter is ramped in either the first phase or the second phase in a first direction over at least three cycles and then ramped in a second direction opposite the first direction over at least three cycles.

These and other features of the present invention will be described in more details below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
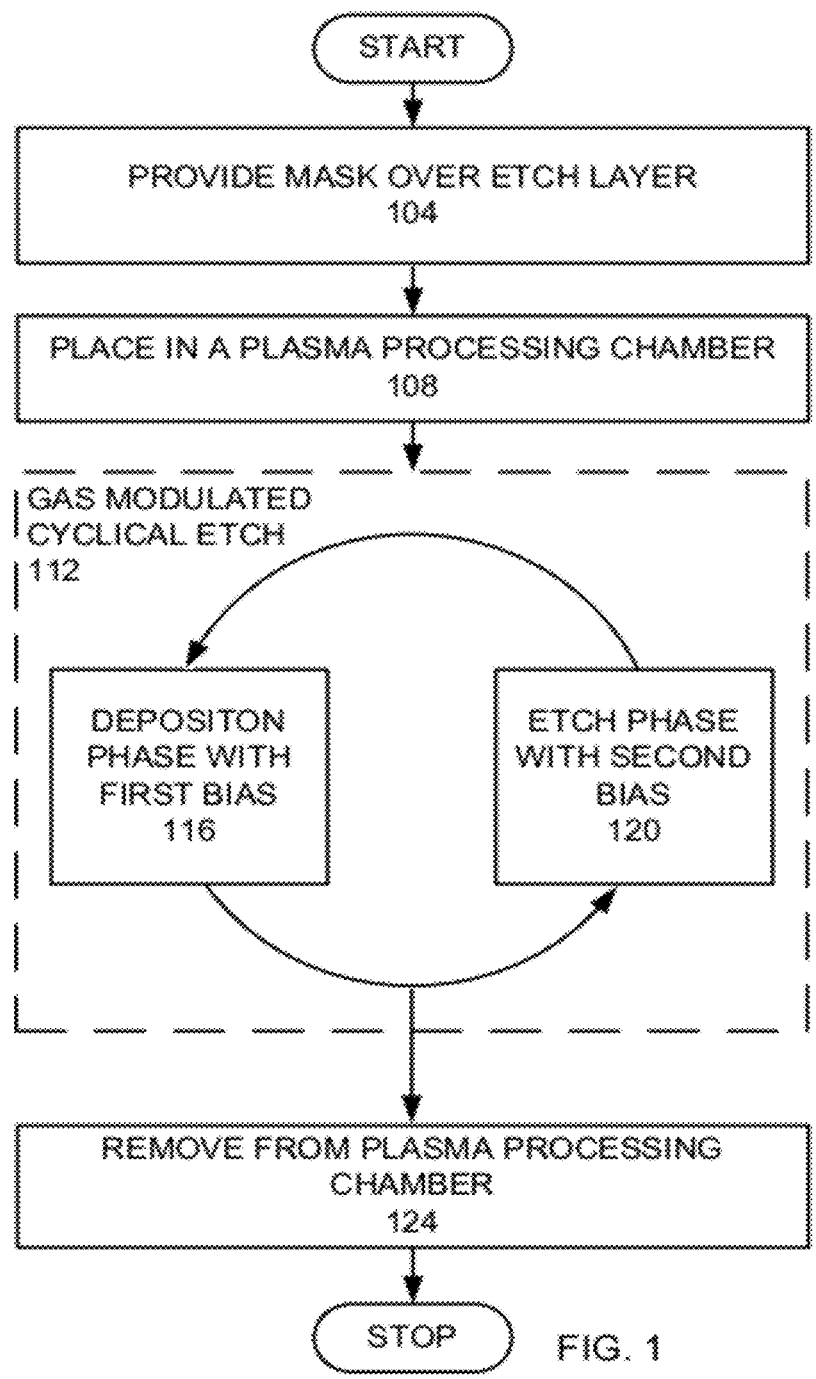
FIG. 1 is a flow chart of an embodiment of the invention.

FIG. 1 is a high level flow chart of an embodiment of the invention. In this embodiment, a patterned mask is formed over an etch layer on a substrate (step 104). The etch layer may be part of the substrate, such as a silicon layer of a silicon wafer or may be a layer over the substrate, such as a dielectric or conductive layer. The substrate is placed in a plasma processing chamber (step 108). The etch layer is subjected to a gas modulated cyclical etch (step 112). The gas modulated cyclical etch comprises a plurality of cycles, where each cycle comprises a deposition phase with a first bias (step 116) and an etch phase with a second bias lower than the first bias (step 120). The wafer is then removed from the plasma processing chamber (step 124).

Example

Figure 2A:
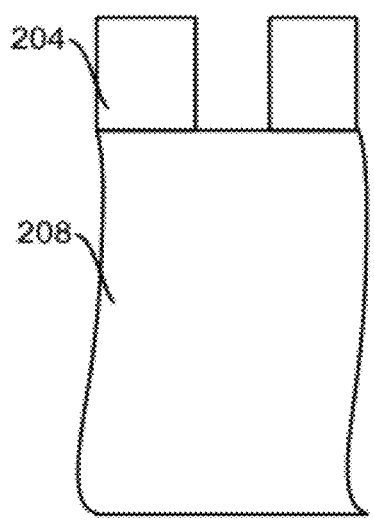
FIGS. 2A-D are schematic views of the formation of a feature using the inventive process.

In a preferred embodiment of the invention, the features to be etched are through semiconductor wafer vias (TSVs). In this embodiment, the mask is a photoresist mask patterned on a silicon wafer (step 104). FIG. 2A is a schematic cross-sectional view of a silicon wafer 208, over which a patterned organic mask 204 has been formed. One or more intermediate patterning layers, such as an antireflective coating (ARC) may be disposed between the silicon wafer (substrate) 208 and the patterned organic mask 204 to improve the mask patterning process.

Figure 3:
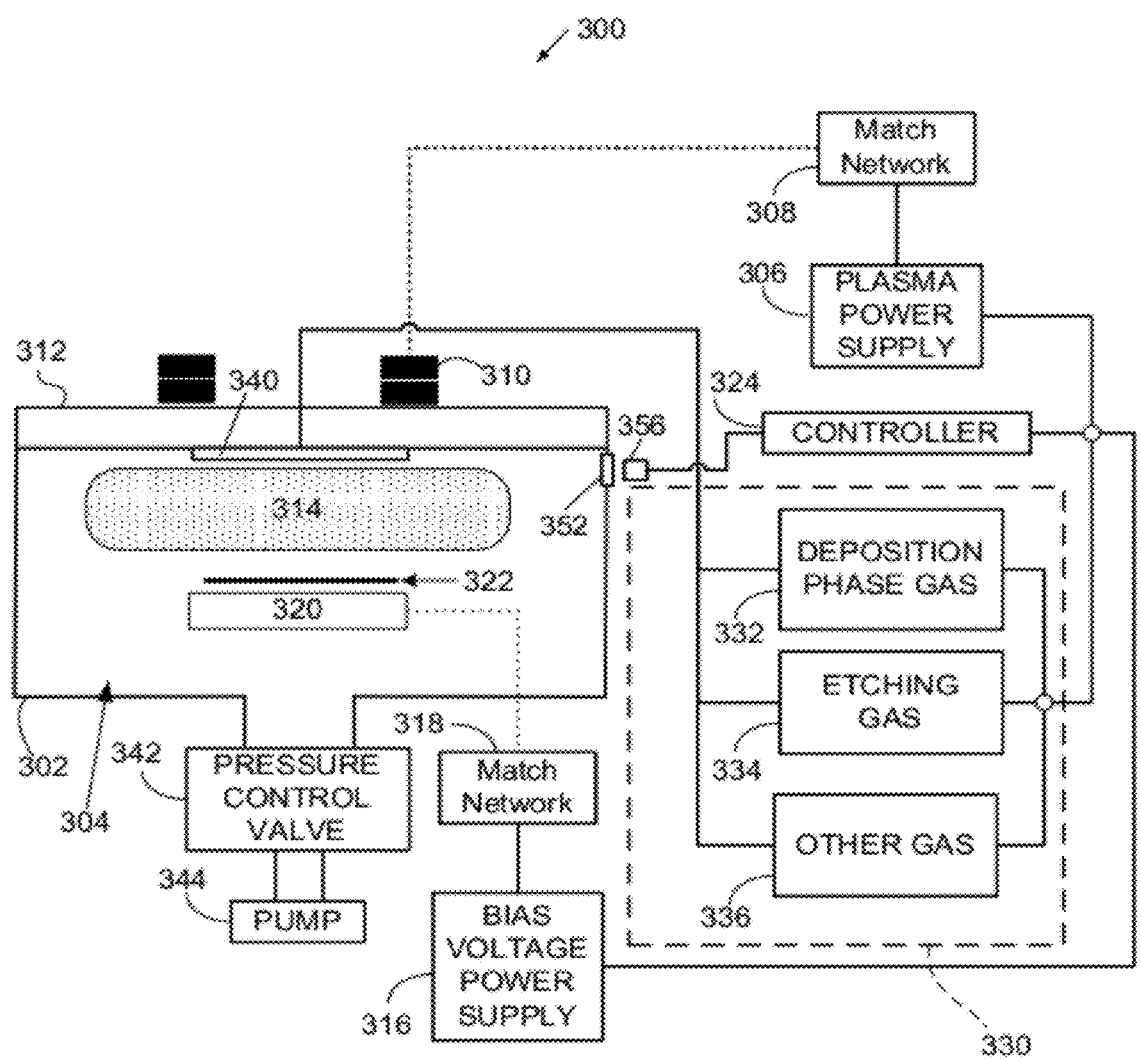
FIG. 3 is a schematic view of a plasma processing chamber that may be used in an embodiment of the invention.

The substrate is placed in a processing tool (step 108). FIG. 3 schematically illustrates an example of a plasma processing system 300 which may be used to perform the process of etching a silicon wafer in accordance with one embodiment of the present invention. The plasma processing system 300 includes a plasma reactor 302 having a plasma processing chamber 304 therein. A plasma power supply 306, tuned by a match network 308, supplies power to a TCP coil 310 located near a power window 312 to create a plasma 314 in the plasma processing chamber 304. The TCP coil (upper power source) 310 may be configured to produce a uniform diffusion profile within processing chamber 304. For example, the TCP coil 310 may be configured to generate a toroidal power distribution in the plasma 314. The power window 312 is provided to separate the TCP coil 310 from the plasma chamber 304 while allowing energy to pass from the TCP coil 310 to the plasma chamber 304. A wafer bias voltage power supply 316 tuned by a match network 318 provides power to an electrode 320 to set the bias voltage on a wafer 322 which is supported by the electrode 320. A controller 324 sets points for the plasma power supply 306 and the wafer bias voltage supply 316.

The plasma power supply 306 and the wafer bias voltage power supply 316 may be configured to operate at specific radio frequencies such as, for example, 13.56 MHz, 27 MHz, 2 MHz, 400 kHz, or combinations thereof. Plasma power supply 306 and wafer bias power supply 316 may be appropriately sized to supply a range of powers in order to achieve desired process performance. For example, in one embodiment of the present invention, the plasma power supply 306 may supply the power in a range of 300 to 10000 Watts, and the wafer bias voltage power supply 316 may supply a bias voltage of in a range of 10 to 1000 V. In addition, the TCP coil 310 and/or the electrode 320 may be comprised of two or more sub-coils or sub-electrodes, which may be powered by a single power supply or powered by multiple power supplies.

As shown in FIG. 3, the plasma processing system 300 further includes a gas source/gas supply mechanism 330. The gas source includes a deposition phase gas source 332, an etching phase gas source 334, and optionally, an additional gas source 336. The gas sources 332, 334, and 336 are in fluid connection with processing chamber 304 through a gas inlet, such as a shower head 340. The gas inlet may be located in any advantageous location in chamber 304, and may take any form for injecting gas. Preferably, however, the gas inlet may be configured to produce a "tunable" gas injection profile, which allows independent adjustment of the respective flow of the gases to multiple zones in the process chamber 304. The process gases and byproducts are removed from the chamber 304 via a pressure control valve 342 and a pump 344, which also serve to maintain a particular pressure within the plasma processing chamber 304. The gas source/gas supply mechanism 330 is controlled by the controller 324. A 2300 Syndion by Lam Research Corp. may be used to practice an embodiment of the invention. To this device, and optical window 352 is added. An optical spectrometer 356 is positioned to measure light from the plasma that passes through the optical window 352. Output from the optical spectrometer 356 is provided to the controller 324.

Figure 4:
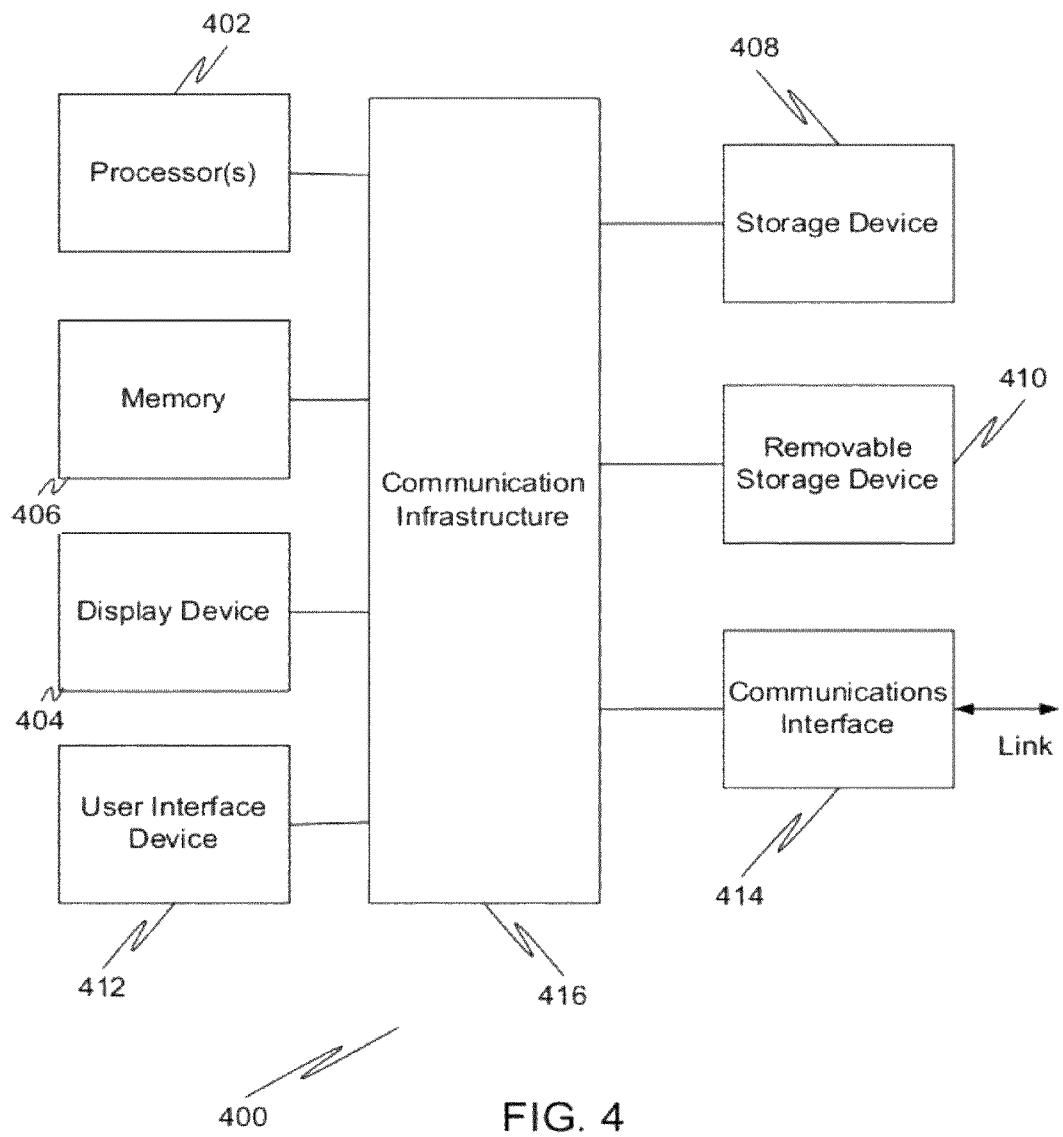
FIG. 4 is a schematic view of a computer system that may be used in practicing the invention.

FIG. 4 is a high level block diagram showing a computer system 400, which is suitable for implementing a controller 324 used in embodiments of the present invention. The computer system may have many physical forms ranging from an integrated circuit, a printed circuit board, and a small handheld device up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments of the present invention may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2B:
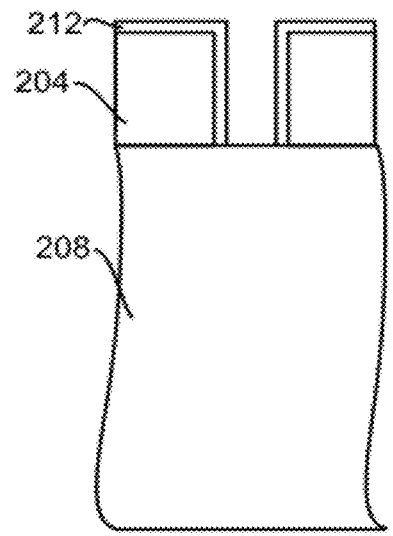
Figure 5:
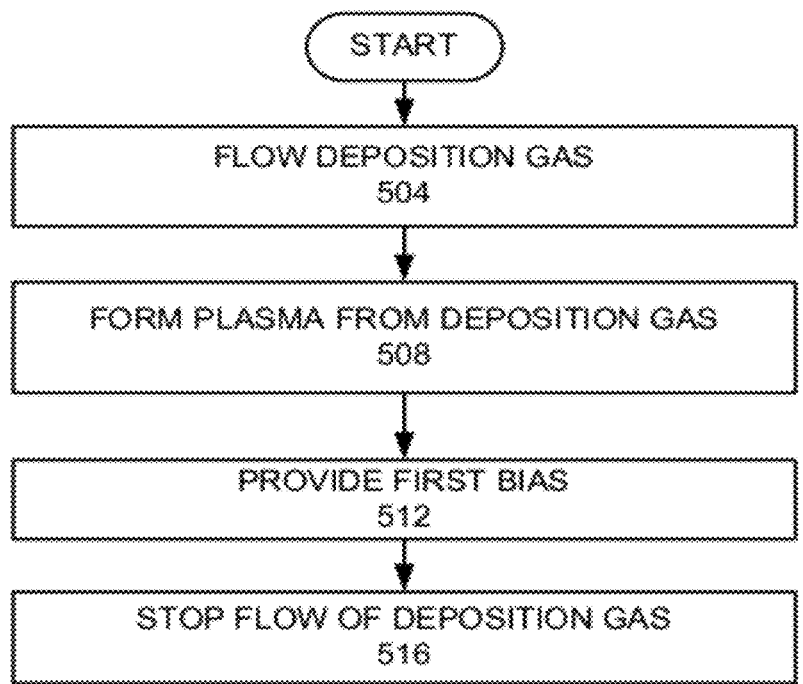
FIG. 5 is a more detailed flow chart of the deposition phase.

The etch layer is subjected to a gas modulated cyclical etch (step 112). The gas modulated cyclical etch comprises a plurality of cycles, where each cycle comprises a deposition phase with a first bias (step 116) and an etch phase with a second bias less than the first bias (step 120). FIG. 5 is a more detailed flow chart of the deposition phase. A deposition gas is flowed into the plasma processing chamber 304 (step 504). The deposition gas is formed into a plasma (step 508). A first bias is provided (step 512). The flow of the deposition gas is stopped (step 516). FIG. 2B is a cross-sectional view of the silicon wafer 208 and mask 204 after a deposition layer 212 has been formed during the deposition phase (step 116). The high bias during deposition is used to remove deposition at the bottom of the features.

An example of a deposition recipe provides a flow of 100 sccm $C_4F_8$ to the plasma pressure chamber. A pressure of 100 mTorr, a bias of 500 volts, and 2000 Watts of RF are provided.

Figure 2C:
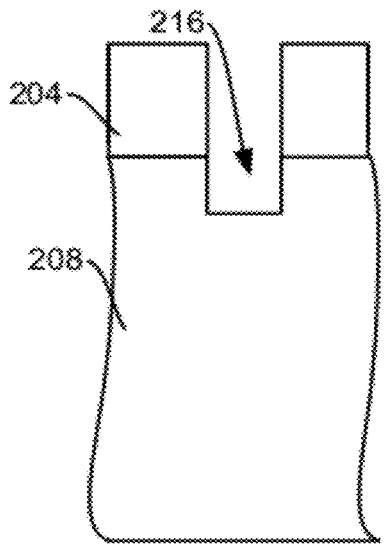
Figure 6:
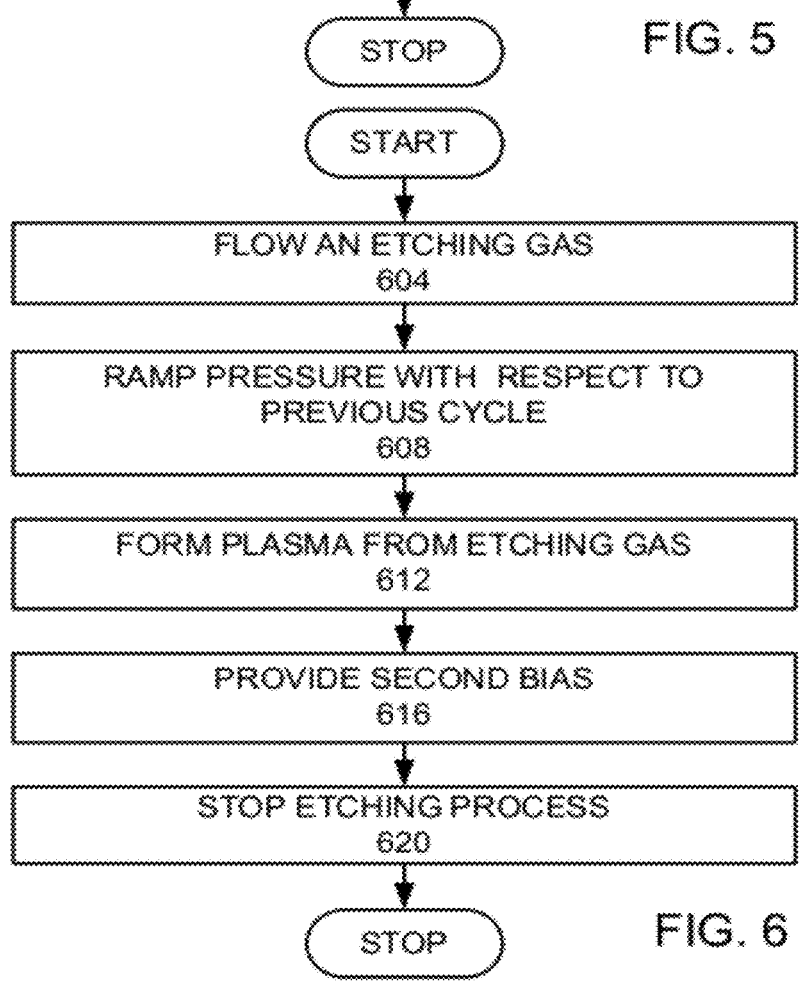
FIG. 6 is a more detailed flow chart of the etch phase.

FIG. 6 is a more detailed flow chart of the etch phase (step 120). An etch gas is flowed into the plasma processing chamber 304 (step 604). The pressure during the etch phase is ramped with respect to the previous cycle (step 608). The etch gas is formed into a plasma (step 612). A second bias which is less than the first bias is provided (step 616). The flow of the etch gas is stopped (step 620). FIG. 2C is a cross-sectional view of the silicon wafer 208 and mask 204 after an etch phase (step 120), which forms part of the etch feature 216.

An example of an etch recipe provides a flow of 150 sccm $SF_6$ to the plasma process chamber. When the presence of $SF_6$ is detected in the plasma processing chamber, a pressure of 120 mTorr a bias of 200 volts, and 2300 Watts of RF power are provided to the plasma processing chamber.

Figure 2D:
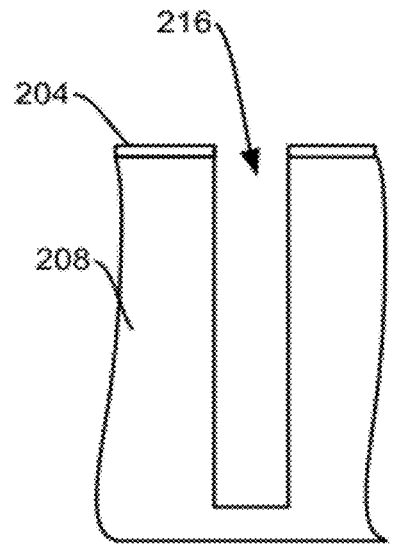

FIG. 2D is a cross-sectional view of the silicon wafer 208 and mask 204 after over 100 cycles of the deposition phase and the etch phase, where the etch feature 216 is almost completely etched.

In an embodiment where the silicon wafer is the etch layer, the silicon wafer may be etched completely through to form through silicon vias. In an embodiment where the etch layer is a dielectric layer, the plasma processing chamber may provide capacitive coupling instead of inductive coupling. In another embodiment, the etch layer may be a conductive layer.

Without being bound by theory, in the prior art using a single etch step before gas modulation, a high bias was used for the etch process. The high bias provided a directional anisotropic etch. Otherwise, an isotropic etch would cause the etch features to be rounded on the sides (bowed) instead of having a straight profile. The high bias etch was carried to the gas modulation process using a plurality of cycles of deposition and etches to provide an etch. The high biased etch was used to provide a directional etch which in addition to etching would clear polymer at the bottom of the etch features.

The invention unexpectedly found that using a directional anisotropic deposition phase in a gas modulation process allows for the use of a non-directional isotropic etch phase providing an improved etch. The high bias deposition has been found to provide deposition on the tops and sidewalls of the etch features, but not at the bottoms of the etch features. It has been found that the high bias during the deposition may be used to sputter away deposition on the bottoms of the etch features. Because the deposition selectively deposited on the tops and sidewalls of the etch features, without deposition on the bottoms of the etch features, a subsequent non-directional anisotropic etch will etch the bottoms of the etch features as the sidewalls and top depositions protect the sidewalls and tops of the etch features. The anisotropic non-directional etch phase etches faster than a directional etch phase and causes less damage to the sidewalls than a directional etch phase, which subjects sidewalls to ion bombardment. Etchant ion bombardment of sidewalls from a high bias directional etch phase causes defects in the forms of striation, bowing, roughness, and the formation of silicon shards. Therefore not only does the bias applied by the invention increase the etch rate, the bias of the invention improves feature shape, reducing sidewall damage, such as striation, bowing, roughness, and the formation of silicon shards.

Preferably, the bias is provided at a frequency between 100 kHz and 1 MHz. More preferably, the bias is provided at a frequency between 300 kHz to 500 kHz. Most preferably, the bias is provided at a frequency of about 400 kHz. Preferably, the first bias during the deposition phase is from 300 to 1000 volts. More preferably, the first bias during the deposition phase is 400 to 800 volts. Most preferably, the first bias during the deposition phase is 500 to 700 volts. Preferably, the second bias during the etch phase is between 0 to 300 volts. More preferably, the second bias during the etch phase is between 0 to 250 volts. Most preferably, the second bias during the etch phase is less than 150 volts. Such voltage ranges were found to provide the highest etch rates with the least sidewall damage and best profiles.

Figure 7:
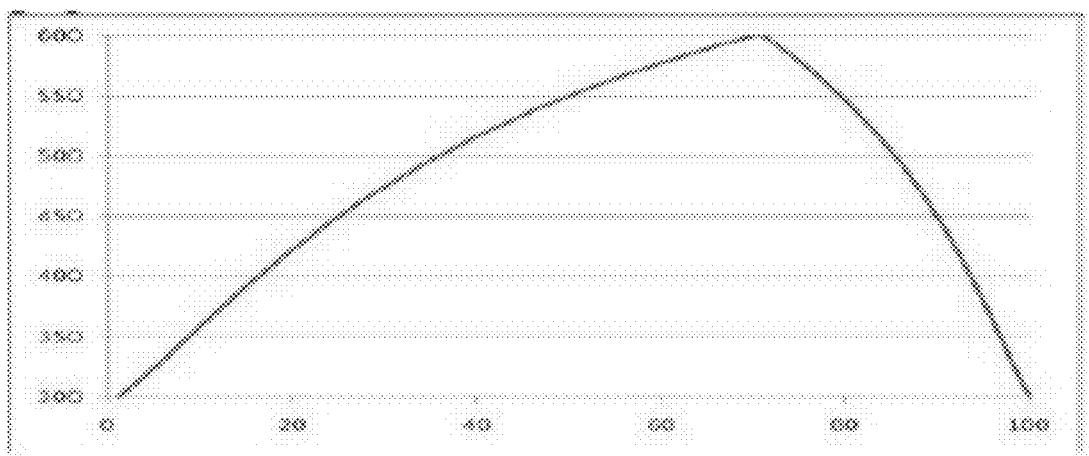
FIG. 7 illustrates the pressure ramping during the etching phase.
Figure 8:
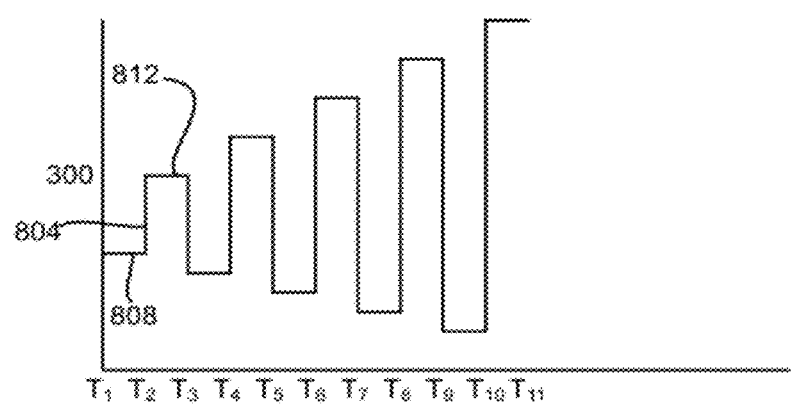
FIG. 8 illustrates pressure oscillation during a plurality of cycles.

FIG. 7 is a graph of a pressure ramp during the etching phase over 100 cycles, used in this embodiment of the invention. In this embodiment, pressure during the etching phase is first ramped up over about 70 cycles from about 300 mtorr to about 600 mtorr and then ramped down over about 30 cycles from about 600 mtorr to about 300 mtorr. FIG. 8 is a more detailed graph of pressure 804, showing both the deposition phase pressure 808 and etching phase pressure 812 over 5 cycles, that would be an example of a process that provides part of the etching phase pressure ramp shown in FIG. 7. In this example, the deposition phase pressure 808 is lower than the etching phase pressure 812. In this example, the deposition phase pressure decreases, as shown in that the deposition phase pressure from $T_3$ to $T_4$ is lower than the deposition phase pressure from $T_1$ to $T_2$. In contrast in this example, the etching phase pressure increases, as shown in that the etching phase pressure from $T_4$ to $T_5$ is higher than the etching phase pressure from $T_2$ to $T_3$. Although the pressure from phase to phase oscillates from cycle to cycle, in FIG. 8, the etching phase pressure increases and the deposition phase pressure decreases. It has been found that initially in etching a via, it is desirable to start at a low etching pressure to help reduce undercutting. As the via depth increases, pressure is increased to increase the etch rate. After the vias reach certain depth, it has been found that it is desirable to decrease etch pressure to improve critical etch profile and maintain etch rate. As a result, it has been found that providing an etch that first ramps up pressure and then ramps down pressure increases the overall etch rate.

In another embodiment, the invention provides a semiconductor process that comprises a plurality of cycles comprising at least a first phase and a second phase. The first phase flows a first phase gas, which is formed into a plasma. The flow of the first phase gas is then stopped. The second phase flows a second phase gas, which is formed into a plasma. The flow of the second phase gas is then stopped. In either the first phase or second phase a parameter is ramped in a first direction from cycle to cycle and over at least three cycles. The parameter is then ramped in a second direction from cycle to cycle over at least three cycles, where the first direction is opposite the second direction. More preferably, the parameter is ramped in the first direction for more than ten cycles and then ramped in the second direction more than ten cycles. Most preferably, the parameter is ramped in the first direction for more than 20 cycles and then ramped in the second direction more than 20 cycles. Increasing the number of cycles over which the ramping takes place provides an increased etch rate and improved feature shape. The parameter may be any plasma processing parameter such as bias RF power, ionization RF power, pressure, phase time, and gas flows. As shown in FIG. 8, one phase may ramp a parameter in one direction while another phase ramps the same parameter in the opposite direction. Preferably, the parameters are ramped independently. Other parameters may be independently ramped. The ramp shape can be linear or non-linear.

While this invention has been described in terms of several preferred embodiments, there are alterations, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for etching features into an etch layer in a plasma processing chamber, wherein the etch layer is a silicon based etch layer, wherein the etch features are through silicon vias, comprising a plurality of cycles, wherein each cycle comprises:

a deposition phase, comprising:
      providing a flow of deposition gas;
      forming a plasma from the deposition gas in the plasma processing chamber;
      providing a first bias during the deposition phase to provide an anisotropic deposition, wherein the bias during deposition phase is between 400 to 800 volts; and
      stopping the flow of the deposition gas into the plasma processing chamber;
   an etching phase, comprising:
      providing a flow of an etch gas;
      forming a plasma from the etch gas in the plasma processing chamber;

providing a second bias during the etch phase, wherein the first bias is greater than the second bias, wherein the bias during the etch phase is between 0 to 200 volts; and stopping the flow of the etch gas into the plasma processing chamber; and ramping a parameter in either the deposition phase or the etch phase in a first direction over at least three cycles and ramping the parameter is a second direction opposite the first direction over at least three cycles.

2. The method, as recited in claim 1, wherein the parameter is pressure during the etching phase wherein the first direction is ramping up the pressure and the second direction is ramping down the pressure.

3. The method, as recited in claim 1, wherein the wherein the ramping in the first direction is for at least 10 cycles and wherein the ramping in the second direction is for at least 10 cycles.

4. The method, as recited in claim 1, wherein the wherein the ramping in the first direction is for at least 20 cycles and wherein the ramping in the second direction is for at least 20 cycles.

5. The method, as recited in claim 1, wherein the plurality of cycles is over 100 cycles.

6. A method for providing a gas modulated semiconductor process in a plasma processing chamber, comprising a plurality of cycles, wherein each cycle comprises:

a first phase, comprising:
providing a flow of first phase gas;
forming a plasma from the first phase gas in the plasma processing chamber; and
stopping the flow of the first phase gas into the plasma processing chamber;

a second phase, comprising:
providing a flow of second phase gas;
forming a plasma from the second phase gas in the plasma processing chamber; and
stopping the flow of the second phase gas into the plasma processing chamber; and ramping a parameter in either the first phase or the second phase in a first direction over at least three cycles and ramping the parameter is a second direction opposite the first direction over at least three cycles.

7. The method, as recited in claim 6, wherein the ramping of the parameter in the first phase is independent of ramping of the first parameter in the second phase.

8. The method, as recited in claim 6, wherein the parameter is pressure during the second phase, wherein the second phase is an etching phase and wherein the first direction is ramping up the pressure and the second direction is ramping down the pressure.

9. The method, as recited in claim 6, wherein the wherein the ramping in the first direction is for at least 10 cycles and wherein the ramping in the second direction is for at least 10 cycles.

10. The method, as recited in claim 9, wherein the parameter is ramped in the first phase, and further comprising ramping the parameter in an opposite direction during the second phase.

11. The method, as recited in claim 6, wherein the wherein the ramping in the first direction is for at least 20 cycles and wherein the ramping in the second direction is for at least 20 cycles.

12. The method, as recited in claim 11, wherein the plurality of cycles is over 100 cycles.

* * * * *